United States Patent [19]

Kaneko

[11] Patent Number: 5,663,911
[45] Date of Patent: Sep. 2, 1997

[54] SEMICONDUCTOR DEVICE HAVING A BOOSTER CIRCUIT

[75] Inventor: Tetsuya Kaneko, Kawasaki, Japan

[73] Assignee: Kabushiki Kaisha Toshiba, Kawasaki, Japan

[21] Appl. No.: 568,533

[22] Filed: Dec. 7, 1995

[30] Foreign Application Priority Data

Dec. 9, 1994 [JP] Japan .................................. 6-305983

[51] Int. Cl.[6] ........................................................ G11C 7/00
[52] U.S. Cl. ................................ 365/189.11; 365/230.06
[58] Field of Search ........................... 365/189.09, 189.11, 365/230.06, 226

[56] References Cited

U.S. PATENT DOCUMENTS 4,896,297  1/1990  Miyatake et al. .................... 365/189.11

OTHER PUBLICATIONS

Nakagome et al., "A 1.5V Circuit Technology for 64Mb DRAMs", *1990 Symposium on VLSI Circuits*, pp. 17–18.

*Primary Examiner*—Joseph A. Popek
*Attorney, Agent, or Firm*—Banner & Witcoff, Ltd.

[57] ABSTRACT

A first transistor is connected between an external power supply and an output node. To increase a voltage of the output node up to a boost voltage, the first transistor is first turned on in response to a first signal and then increases the voltage of the output node up to a voltage of the external power supply. A second transistor is connected between a booster circuit and the output node and turned on in response to a second signal after a lapse of a predetermined period of time after the first signal to increase the voltage of the output node up to the boost voltage. A third transistor is connected between the output node and ground and turned on in response to a third signal when the voltage of the output node is equal to a ground potential.

22 Claims, 6 Drawing Sheets

SEMICONDUCTOR DEVICE HAVING A BOOSTER CIRCUIT

BACKGROUND OF THE INVENTION

1. Field of the Invention

The present invention is applied to a dynamic random access memory (referred to as a DRAM hereinafter) and specifically relates to a semiconductor integrated circuit including a booster circuit for generating a boost voltage which is higher than an external power supply voltage.

2. Description of the Related Art

Since a currently-used DRAM requires voltages of different levels in an integrated circuit, a plurality of voltage generator circuits are arranged in the integrated circuit, and a desired voltage is generated from each of the voltage generator circuits. These circuits comprise a substrate voltage generator circuit for generating a substrate potential and a well potential, an internal power supply voltage generator circuit for generating an internal power supply voltage of the memory, and a reference voltage generator circuit for generating a reference voltage serving as an internal reference potential. Since the plural voltage generator circuits are provided in the integrated circuit, it can be a single external power supply voltage that is applied from outside the integrated circuit.

The voltage generator circuits are classified into booster circuits and pull-down circuits according to their functions. The voltage generator circuits are employed in order to improve an operation margin of the integrated circuit for the external power supply voltage and secure the reliability of the integrated circuit. Recently the external power supply voltage tends to decrease and thus various types of DRAMs loaded with a booster circuit as a voltage generator circuit are proposed. Such a DRAM is disclosed in, for example, Y. NAKAGOME et al., 1990 Symposium on VLSI Circuit, pp. 17–18. In a DRAM mounted with a booster circuit, an output voltage of the booster circuit is applied to a word line driving circuit for driving word lines and an equalizing circuit for charging a pair of bit lines to a predetermined potential. In a shared sense amplification system, the output voltage is applied to a connecting circuit for connecting a sense amplifier and a pair of bit lines, and the like.

The operating efficiency of the booster circuit is not generally too high. Therefore, when the memory increases in capacity and so do the word line driving circuit, equalizing circuit, and connecting circuit, which serve as loads of the booster circuit, the application of boost voltage to these loads increases the burden of the booster circuit.

It can thus be considered to enhance the current supply capability of the booster circuit; however, it is not advisable to do so since the chip size and current consumption are increased. It can also be considered not to use a booster circuit. In this case, however, when the external power supply voltage is lowered, it is likely that it will be difficult to secure the reliability of the integrated circuit because of long access time and low sense margin.

SUMMARY OF THE INVENTION

It is accordingly an object of the present invention to provide a semiconductor integrated circuit capable of generating a desired boost voltage while preventing a chip size and current consumption from increasing and securing its reliability even when an external power supply voltage is lowered.

To attain the above object, there is provided a semiconductor device comprising:

a booster circuit for receiving an external power supply voltage and generating a boost voltage which is higher than the external power supply voltage;

a first switching circuit having a current path one end of which is connected to the external power supply voltage and another end of which is connected to an output node, the first switching circuit is turned on in response to a first signal to increase a voltage of the output node up to a voltage equivalent to the external power supply voltage and then increase the voltage of the output node up to the boost voltage;

a second switching circuit having a current path one end of which is connected to the booster circuit and another end of which is connected to the output node, the second switching circuit being turned on in response to a second signal when the first switching circuit is turned off, to increase the voltage of the output node up to the boost voltage; and a third switching circuit having a current path one end of which is connected to the output node and another end of which is grounded, the third switching circuit being turned on in response to a third signal to make the voltage of the output node equal to a ground potential.

To increase the output node from a low level voltage to the boost voltage, the output node is first charged with the same voltage as the external power supply voltage by the first switching circuit and then with the boost voltage by the second switching circuit. The booster circuit need not directly charge the output node from the low level to the boost voltage but has only to be increased from the external power supply voltage to the boost voltage. Even when a great load is connected to the output node, the booster circuit can be prevented from increasing in current consumption.

Moreover, a bit line potential setting circuit for charging the potential of a pair of bit lines and increasing these bit lines to the same potential, a word line driving circuit for driving word lines, and a switching circuit for connecting a sense amplifier to the pair of bit lines are controlled by the boost voltage, the current consumption of the booster circuit can be reduced and so can be the chip size, and the operation margin can be secured when the external power supply voltage is low.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to the accompanying drawings.

Figure 1:
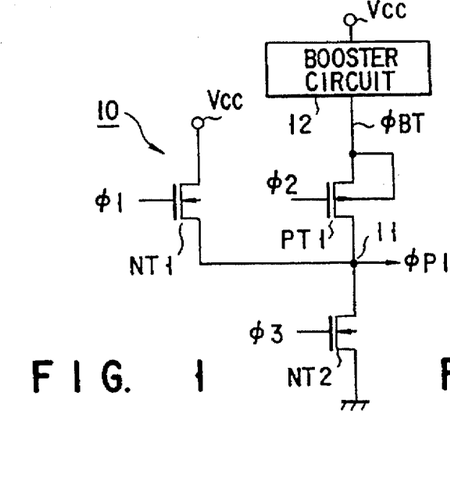
FIG. 1 is a circuit diagram of a first embodiment of the present invention.

FIG. 1 shows a first embodiment wherein a voltage control circuit is provided between a booster circuit and various types of loads. The voltage control circuit 10 includes transistors NT1 and NT2 of N-channel MOSFETs and a transistor PT1 of a P-channel MOSFET. The drain of the transistor NT1 is supplied with an external power supply voltage Vcc, the gate thereof is supplied with a signal $\phi 1$, and the source thereof is connected to an output node 11. An equalizer circuit for equalizing bit lines, a word line driving circuit for driving word lines, and the like, which will be described later, are connected to the output node 11.

The booster circuit 12 boosts the external power supply voltage Vcc and outputs a boost voltage $\phi BT$. The source and back gate (substrate) of the transistor PT1 are connected to an output terminal of the booster circuit 12 to receive the boost voltage $\phi BT$ from the booster circuit 12. The drain of the transistor PT1 is connected to the output node 11, and the gate thereof is supplied with a signal $\phi 2$. The source of the transistor NT2 is grounded, the drain thereof is connected to the output node 11, and the gate thereof is supplied with a signal $\phi 3$.

Figure 2:
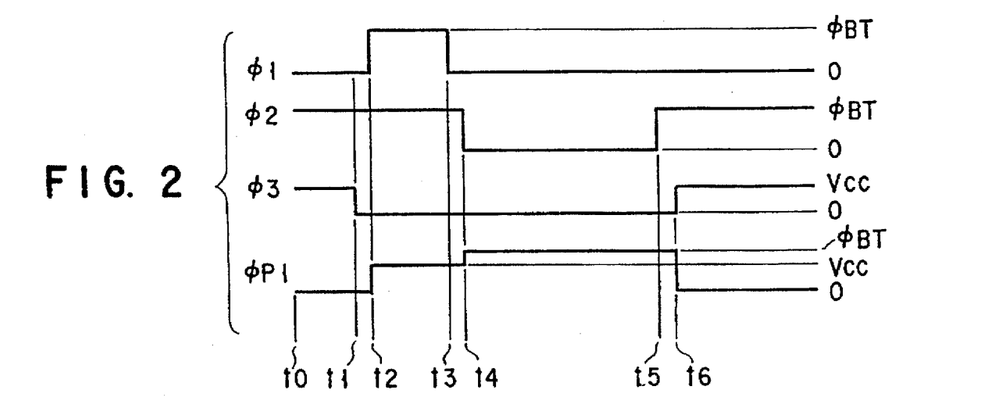
FIG. 2 is a timing chart showing an operation of the first embodiment of FIG. 1.

FIG. 2 is a timing chart for explaining an operation of the circuits shown in FIG. 1, in which the output node 11 is charged to the boost voltage.

In FIG. 2, the signals $\phi 2$ and $\phi 3$ are high in level between time t0 and time t1, while the signal $\phi 1$ is low in level. In this time period, the transistor NT2 is turned on, and the transistors NT1 and PT1 are turned off; accordingly, an output voltage $\phi P1$ becomes equal to a ground potential.

If the signal $\phi 3$ changes from the high level (external power supply voltage Vcc) to the low level at time t1, the transistor NT2 is turned off. In other words, the output voltage $\phi P1$ remains in a floating state until time t2 when the signal $\phi 1$ changes from the low level to the high level (boost voltage $\phi BT$).

If the signal $\phi 1$ changes from the low level the high level at time t2, the transistor NT1 is turned on, and the output voltage $\phi P1$ is increased up to the same potential as the external power supply voltage Vcc. At this time, the transistor PT1 remains in an off-state.

If the signal $\phi 1$ changes from the high level to the low level at time t3, the transistor NT1 is turned off. The transistor NT1 remains in a floating state until time t4 when the signal $\phi 2$ changes from the high level to the low level.

If the signal $\phi 2$ changes from the high level to the low level at time t4, the transistor PT1 is turned on. The output node 11 is thus charged with the boost voltage $\phi BT$ output from the booster circuit 12, and the output voltage $\phi P1$ is increased up to the boost voltage $\phi BT$. The transistor NT2 remains still in an off-state.

To restore the output voltage $\phi P1$ of the output node 11 to the ground potential, the voltage control circuit 10 operates as follows. If the signal $\phi 2$ changes from the low level to the high level at time t5, the transistor PT1 is turned off. At this time, the transistor NT2 is turned off, and thus the output voltage $\phi P1$ remains in a floating state until time t6.

If the signal $\phi 3$ changes from the low level to the high level (Vcc) at time t6, the transistor NT2 is turned on, the output node 11 is discharged, and the output voltage $\phi P1$ becomes equal to the ground potential.

According to the first embodiment described above, the output voltage $\phi P1$ corresponds to the ground potential from t0 to t2, increases from the ground potential to the external power supply voltage Vcc between t2 and t4, and increases up to the boost voltage $\phi BT$ from t4 to t6. In other words, as shown in FIG. 2, the output voltage $\phi P1$ increases two times. According to the conventional method, when the output voltage $\phi P1$ is increased from the ground potential to the boost voltage $\phi BT$, all charges of an output node are supplied from the boost voltage $\phi BT$. In contrast, according to the first embodiment of the present invention, the charges are first supplied to the output node 11 from the external power supply and then from the boost voltage $\phi BT$. Since, therefore, the booster circuit 12 has only to supply the output node 11 with charges necessary for increasing the output voltage $\phi P1$ from the external power supply voltage Vcc to the boost voltage $\phi BT$, the charges are fewer than those in the conventional case. In fact, the operating efficiency of the booster circuit 12 is not so high; therefore, the current consumption thereof can be reduced by performing the above operation of the first embodiment.

The time periods between t1 and t2, t3 and t4, and t5 and t6, during which the output voltage $\phi P1$ is in a floating state, are set for safety to inhibit a through current from flowing between the transistors. In principle, these time periods are not always needed.

Figure 3:
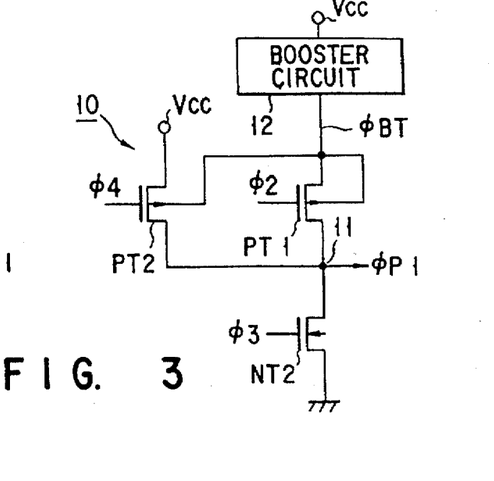
FIG. 3 is a circuit diagram of a second embodiment of the present invention.

FIG. 3 shows a second embodiment of the present invention. In FIG. 3, the same structural elements as those of the first embodiment are denoted by the same reference numerals and symbols, and their descriptions are omitted.

A voltage control circuit 10 of the second embodiment differs from that of the first embodiment in the following point. According to the second embodiment, a transistor PT2 of a P-channel MOSFET is used for the transistor NT1 of an N-channel MOSFET in the first embodiment. The gate of the transistor PT2 is supplied with a signal $\phi 4$ whose phase is opposite to that of the signal $\phi 1$ shown in FIG. 1, and the back gate thereof is supplied with a boost voltage $\phi BT$ from a booster circuit 12.

Figure 4:
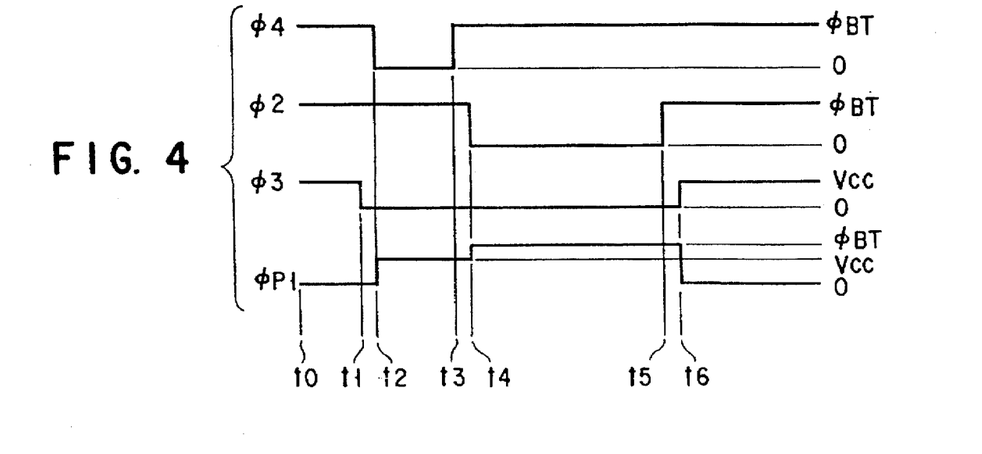
FIG. 4 is a timing chart showing an operation of the second embodiment of FIG. 3.

FIG. 4 is a timing chart for explaining an operation of the second embodiment. As is apparent from FIG. 4, since the operation is virtually the same as that of the first embodiment, its explanation is omitted. The same advantage can be obtained from the second embodiment, too.

Figure 5:
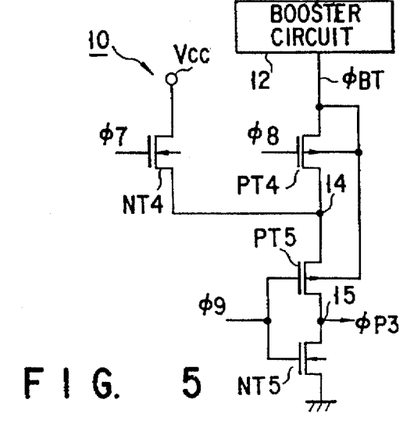
FIG. 5 is a circuit diagram of a third embodiment of the present invention.

FIG. 5 shows a third embodiment of the present invention. A voltage control circuit 10 of this embodiment includes transistors NT4 and NT5 of N-channel MOSFETs and transistors PT4 and PT5 of P-channel MOSFETs. The drain of the transistor NT4 is supplied with an external power supply voltage Vcc, the source thereof is connected to a node 14, and the gate thereof is supplied with a signal $\phi 7$. The source and back gate of the transistor PT4 are connected to a booster circuit 12, the gate thereof is supplied with a signal $\phi 8$, and the drain thereof is connected to the node 14. The source of the transistor PT5 is connected to the node 14, the back gate thereof is connected to the booster circuit 12, and the drain thereof is connected to an output node 15 and then grounded through the transistor NT5. The gates of the transistors PT5 and NT5 are supplied with a signal $\phi 9$, and an output voltage $\phi P3$ is output from the output node 15. An equalizer circuit for equalizing bit lines and a word line driving circuit (neither of which is shown) are connected to the output node 15.

Figure 6:
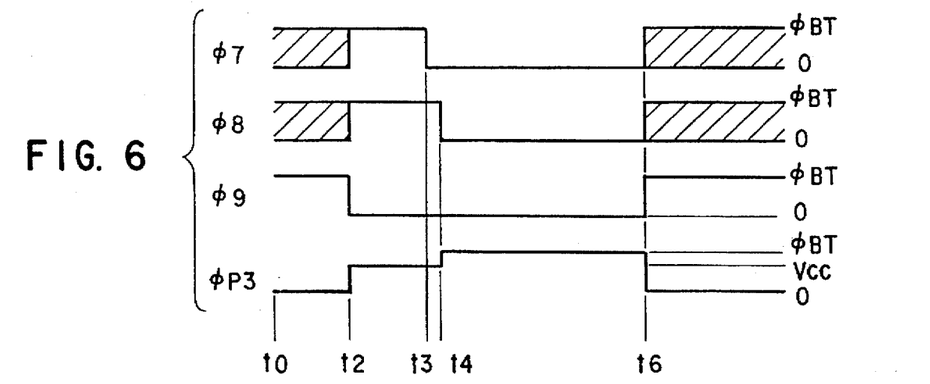
FIG. 6 is a timing chart showing an operation of the third embodiment of FIG. 5.

FIG. 6 is a timing chart for explaining an operation of the third embodiment. Referring to FIG. 6, signals $\phi 7$ and $\phi 8$ are each low or high in level and signal $\phi 9$ is high in level from time t0 to time t2. Therefore, the transistor PT5 is turned off, the transistor NT5 is turned on, and the output voltage $\phi P3$ is set at a ground level.

Since the signal $\phi 9$ becomes low between t2 and t3, the transistor NT5 is turned off and the transistor PT5 is turned on. During this period, the signals $\phi 7$ and $\phi 8$ are rendered high, the transistor NT4 is turned on, and the transistor PT4 is turned off. The output node 15 is thus charged through the transistors NT4 and PT5, and the output voltage $\phi P3$ is increased up to the external power supply voltage Vcc.

If the signal $\phi 7$ is changed to a low level at time t3, the transistor NT4 is turned off, and the output voltage $\phi P3$ goes into a floating state. At time t4, the signal $\phi 8$ changes from the high level to the low level, the transistor PT4 is turned on. Thus, the output node 15 is charged through the transistors PT4 and PT5, and the output voltage $\phi P3$ rises to the boost voltage $\phi BT$.

To restore the output voltage of $\phi P3$ of the output node 15 to the ground potential, the following operation is carried out. If the signal $\phi 9$ changes from the low level to the high level at time t6, the transistor PT5 is turned off and the transistor NT5 is turned on. The output voltage $\phi P3$ falls from the boost voltage $\phi BT$ to the ground potential.

According to the third embodiment described above, during the time period from t0 to t2 and after time t6, the signals $\phi 7$ and $\phi 8$ can be set at whatever potential unless the transistors NT4 and PT4 are turned on simultaneously. The same advantage as that of the first and second embodiments can be obtained from the third embodiment.

Figure 7:
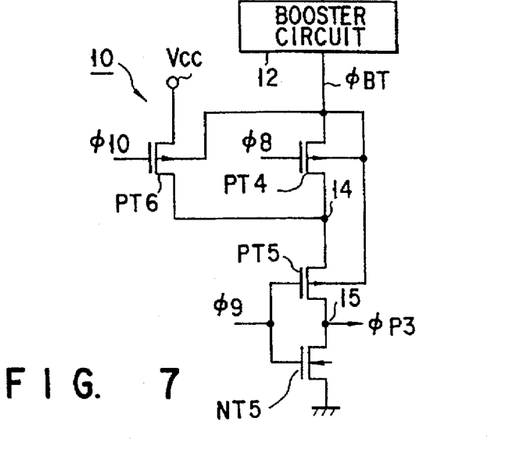
FIG. 7 is a circuit diagram of a fourth embodiment of the present invention.

FIG. 7 shows a fourth embodiment of the present invention. In FIG. 7, the same structural elements as those of the third embodiment are represented by the same reference numerals and symbols, and their descriptions are omitted.

The fourth embodiment differs from the third embodiment in the following point. According to the third embodiment, the transistor NT4 is constituted of an N-channel MOSFET. In the fourth embodiment, the transistor NT4 is replaced with a transistor PT6 constituted of a P-channel MOSFET, and the gate of the transistor PT6 is supplied with a signal $\phi 10$ whose phase is opposite to that of the signal $\phi 7$.

Figure 8:
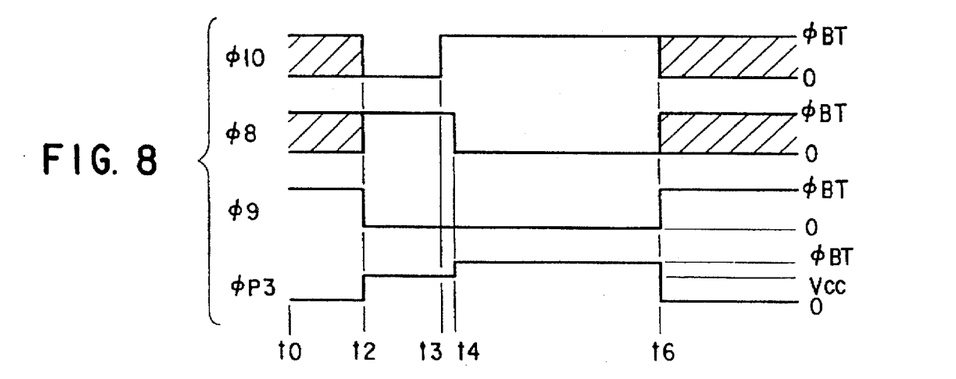
FIG. 8 is a timing chart showing an operation of the fourth embodiment of FIG. 1.

FIG. 8 is a timing chart for explaining an operation of the fourth embodiment. As is apparent from FIG. 8, since the operation is substantially the same as that of the third embodiment, its explanation is omitted. The same advantage can be obtained from the third embodiment, too.

In the above first to fourth embodiments, in order to increase the voltage of the output node to the boost voltage, it is first increased to the potential equivalent to the external power supply voltage Vcc. However, the present invention is not limited to this. The voltage of the output node can be increased to a voltage which is lower than the external power supply voltage Vcc.

Figure 9:
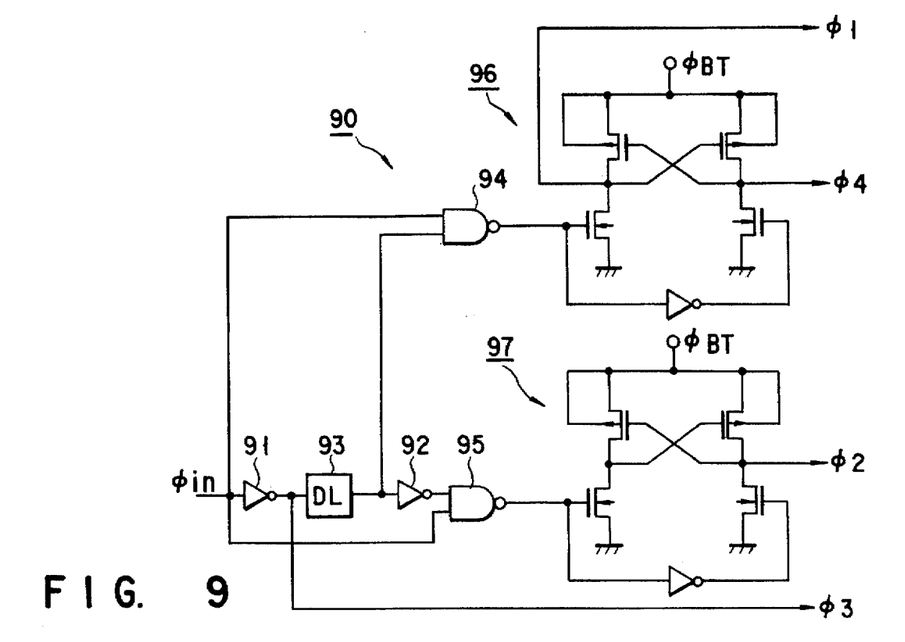
FIG. 9 is a circuit diagram showing an example of a signal generation circuit applied to the present invention.

FIG. 9 shows an example of a signal generation circuit for generating the signals $\phi 1$ to $\phi 4$ of the first and second embodiments. The signal generation circuit 90 shown in FIG. 9 comprises inverter circuits 91 and 92, a delay circuit (DL) 93, NAND circuits 94 and 95, and level conversion circuits 96 and 97. An input signal $\phi in$ whose high level is the same as the level of the external power supply voltage Vcc, is supplied to the inverter circuit 91 and one input terminal of each of the NAND circuits 94 and 95. An output signal of the inverter circuit 91 is supplied to the other input terminal of the NAND circuit 94 through the delay circuit 93, and to the other input terminal of the NAND circuit 95 through the delay circuit 93 and inverter circuit 92. The output signals of the NAND circuits 94 and 95 are supplied to the input terminals of the level conversion circuits 96 and 97. These circuits 96 and 97 convert the input signal $\phi in$ whose high level corresponds to the level of the external power supply voltage Vcc, into a signal whose high level corresponds to the level of the boost voltage $\phi BT$. A signal $\phi 1$ whose high level is equal to the level of the boost voltage $\phi BT$, is output from one output terminal of the level conversion circuit 96, while a signal $\phi 4$ whose high level is equal to the level of the boost voltage $\phi BT$, is output from the other output terminal. Furthermore, a signal $\phi 2$ whose high level corresponds to the level of the boost voltage $\phi BT$ is output from the output terminal of the level conversion circuit 97, and a signal $\phi 3$ whose high level corresponds to the level of the external power supply voltage Vcc is output from the output terminal of the inverter circuit 91.

Figure 10:
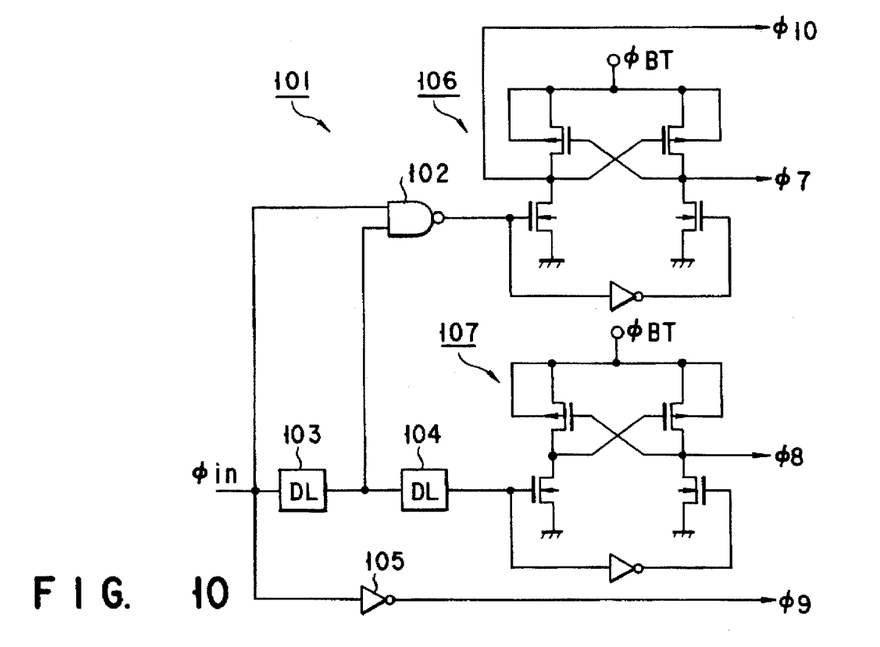
FIG. 10 is a circuit diagram showing another example of the signal generation circuit applied to the present invention.

FIG. 10 shows an example of a signal generation circuit for generating the signals $\phi 7$ to $\phi 10$ of the third and fourth embodiments. The signal generation circuit 101 shown in FIG. 10 comprises a NAND circuit 102, delay circuits (DL) 103 and 104, an inverter circuit 105, and level conversion circuits 106 and 107. An input signal $\phi in$ whose high level is the same as the level of the external power supply voltage Vcc, is supplied to one input terminal of the NAND circuit 102 and to the input terminals of the delay circuit 103 and inverter circuit 105. An output signal of the delay circuit 103 is supplied to the other input terminal of the NAND circuit 102 and to the input terminal of the delay circuit 104. The output signal of the NAND circuit 102 is supplied to the input terminal of the level conversion circuits 106, and that of the delay circuit 104 is supplied to the input terminal of the level conversion circuit 107. These circuits 106 and 107 convert the input signal $\phi in$ whose high level corresponds to the level of the external power supply voltage Vcc, into a signal whose high level corresponds to the level of the boost voltage $\phi BT$. A signal $\phi 10$ whose high level is equal to the level of the boost voltage $\phi BT$, is output from one output terminal of the level conversion circuit 106, while a signal $\phi 7$ whose high level is equal to the level of the boost voltage $\phi BT$, is output from the other output terminal. Furthermore, a signal $\phi 8$ whose high level corresponds to the level of the boost voltage $\phi BT$ is output from the output terminal of the level conversion circuit 107, and a signal $\phi 9$ whose high level corresponds to the level of the external power supply voltage Vcc is output from the output terminal of the inverter circuit 105.

Figure 11:
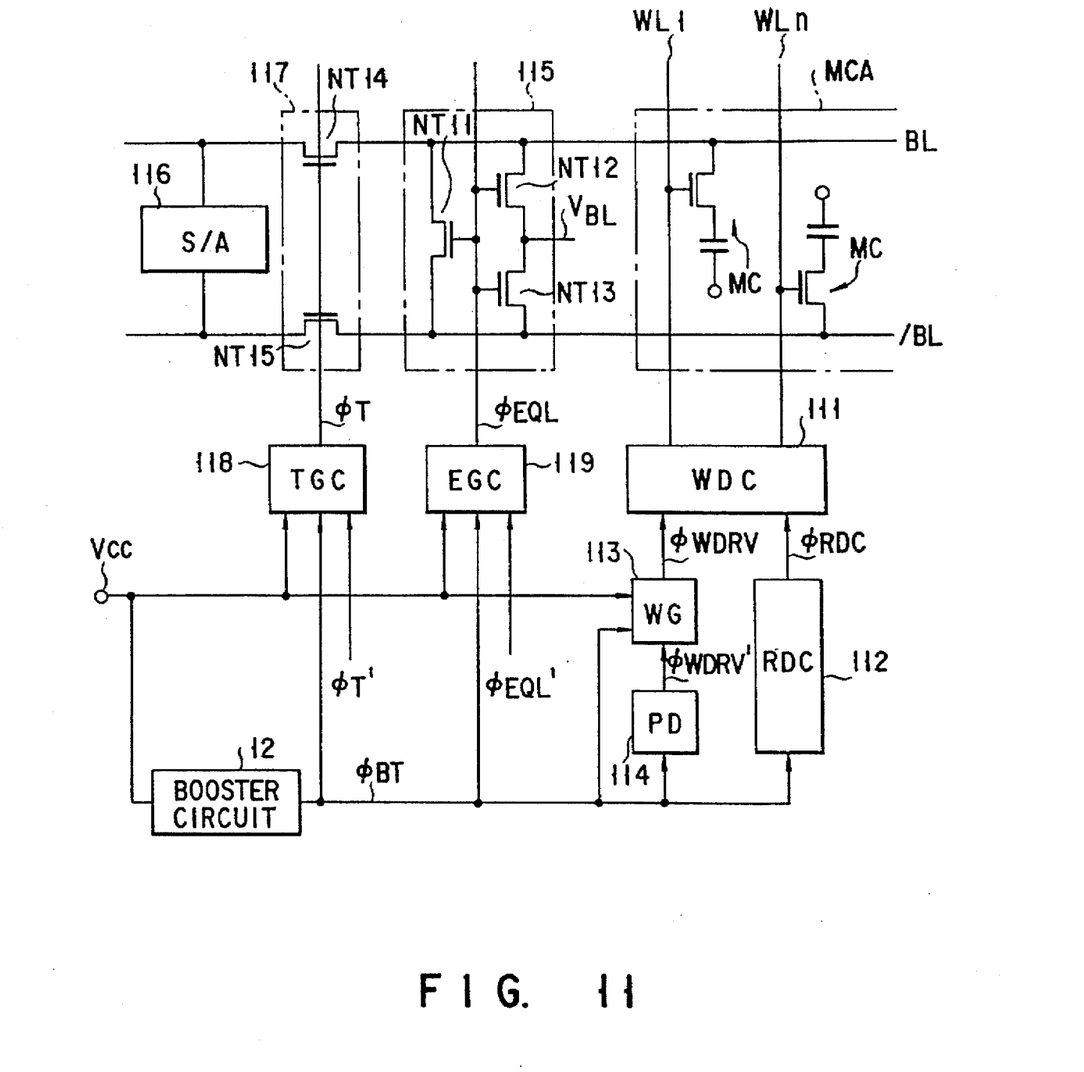
FIG. 11 is a circuit diagram showing an example of a DRAM applied to the present invention.

FIG. 11 illustrates a DRAM of a shared sense amplification system using the voltage control circuit 10 and signal generation circuits 90 and 101 of the first to fourth embodiments. Referring to FIG. 11, a memory cell array MCA includes a plurality of memory cells MC connected to a pair of bit lines BL and /BL and word lines WL1 to WLn. These word lines are connected to a word line driving circuit (WDC) 111. A row decoder (RDC) 112 is connected to the WDC 111, as is a predecoder (PD) 114 via a word line driving voltage generation circuit (WG) 113.

An equalizer circuit 115 having transistors NT11, NT12 and NT13 to equalize the bit lines BL and /BL, and a sense amplifier (S/A) 116 are connected between the bit lines. Further, a connecting circuit 117 including transistors NT14 and NT15 to connect the sense amplifier 116 with the bit lines, is arranged between the equalizer circuit 115 and sense amplifier 116.

A timing signal generation circuit (TGC) 118, an equalizing signal generation circuit (EGC) 119, and word line driving voltage generation circuit 113 are each a combination of the voltage control circuit 10 of the first to fourth embodiments and the signal generation circuits 90 and 101 shown in FIGS. 9 and 10.

The timing signal generation circuit 118 is supplied with an external power supply voltage Vcc, a boost voltage $\phi BT$ output from a booster circuit 12, and an input signal $\phi T'$ serving as the input signal $\phi in$. In response to the input signal $\phi T'$, the circuit 118 generates a signal $\phi T$ whose high level is the same as the level of the boost voltage $\phi BT$. The signal $\phi T$ is sent to the gates of the transistors NT14 and NT15 constituting the connecting circuit 117.

The equalizing signal generation circuit 119 is supplied with the external power supply voltage Vcc, the boost voltage $\phi BT$, and an input signal $\phi EQL'$ serving as the input signal $\phi in$. In response to the input signal $\phi EQL'$, the circuit 119 generates a signal $\phi EQL$ whose high level is the same as that of the boost voltage $\phi BT$. The signal $\phi EQL$ is sent to the gates of the transistors NT11, NT12 and NT13 constituting the equalizer circuit 115.

The word line driving voltage generation circuit 113 is supplied with the external power Supply voltage Vcc, the boost voltage $\phi BT$, and a signal $\phi WDRV'$ output from the predecoder 114 and serving as the input signal $\phi in$. In response to the signal $\phi WDRV'$, the circuit 113 generates a signal $\phi WDRV$ whose high level is the same as that of the boost voltage $\phi BT$. The signal $\phi WDRV$ is sent to the word line driving circuit 111.

In a currently-used DRAM, the number of transistors connected to a timing signal generation circuit and an equalizing signal generation circuit is very large, as is the capacity of gates connected to these circuits. Further, the loads connected to a word line driving voltage generation circuit and a word line driving circuit are considerably increased if the selected number of word lines is large. Therefore, in a conventional booster circuit using simple level conversion, the current supply capability is remarkably high; accordingly, the current consumption increases and so does the chip size.

In contrast, according to the present invention, in order to raise the signals $\phi T$, $\phi EQL$ and $\phi WDRV$, they are first charging them with the external power supply voltage Vcc and then with the boost voltage $\phi BT$ output from the booster circuit as described above, the amount of current supplied from the booster circuit can be greatly reduced. Consequently, the current consumption of the booster circuit can be diminished, while the chip size can be decreased and the operation margin can be secured when the external power supply voltage is low.

The timing signal generation circuit 118, equalizing signal generation circuit 119 and word line driving voltage generation circuit 113, shown in FIG. 11, are each a combination of the voltage control circuit 10 and signal generation circuits 90 and 101. The present invention is not limited to this combination, but each of the circuits 118, 119 and 113 can be constituted by at least one of the circuits 10, 90 and 101.

Figure 12:
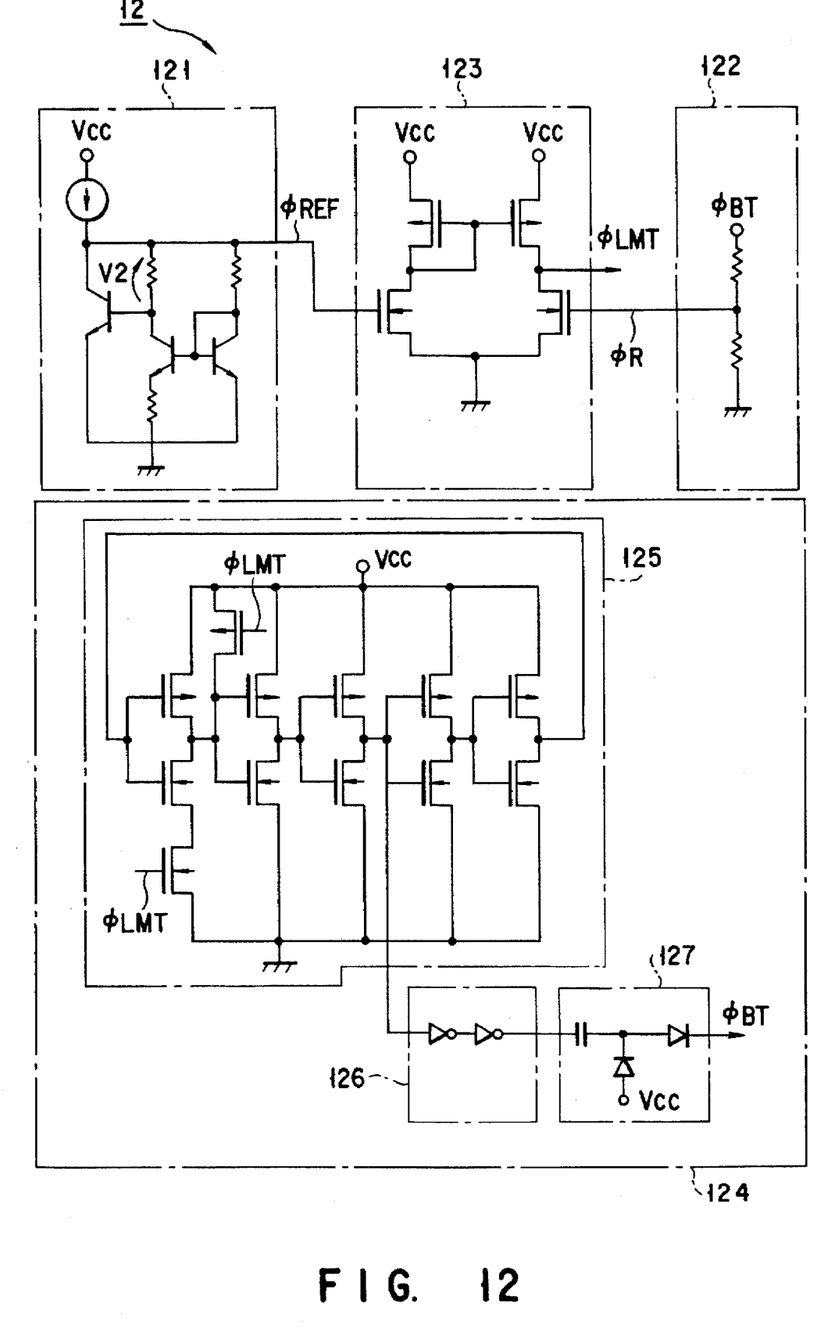
FIG. 12 is a circuit diagram showing an example of a booster circuit applied to the present invention.

FIG. 12 specifically shows the booster circuit 12 of the present invention. The circuit 12 comprises a reference voltage generation circuit 121 for generating a reference voltage $\phi REF$ from the external power supply voltage Vcc, a voltage conversion circuit 122 for dividing a boost voltage $\phi BT$ output from a charge pump circuit 127 (described later) by resistors and converting it into a comparison voltage $\phi R$, a voltage comparison circuit 123 for comparing the boost voltage $\phi BT$ and reference voltage $\phi REF$ and generating a control signal $\phi LMT$ for controlling the boost voltage $\phi BT$ in accordance with the reference voltage $\phi REF$, and a voltage generation circuit 124 for generating a boost voltage $\phi BT$ in response to the control signal $\phi LMT$ output from the voltage comparison circuit 123.

The reference voltage generation circuit 121 is low in dependence upon the external power supply voltage Vcc and constituted by, e.g., a band gap reference circuit. The voltage comparison circuit 123 compares the comparison voltage $\phi R$ output from voltage conversion circuit 122 with the reference voltage $\phi REF$ output from the circuit 121 and, when the boost voltage $\phi BT$ is lower than a preset voltage, generates a control signal $\phi LMT$ and drives the voltage generation circuit 124.

The voltage generation circuit 124 includes an oscillator circuit 125 which oscillates in response to the control signal $\phi LMT$ supplied from the voltage comparison circuit 123, a buffer circuit supplied with an output signal of the oscillator circuit 125, and a charge pump circuit 127 for generating a boost voltage $\phi BT$ upon receiving a signal from the buffer circuit 126. The oscillator circuit 125 is constituted by, e.g., a five-stage ring oscillator. The buffer circuit 126 converts the output signal of the oscillator circuit 125 into a signal suitable for driving the charge pump circuit 127 and is constituted by, e.g., a two-stage inverter. The charge pump circuit 127 includes a capacitor for performing a pump operation and a diode for causing charges to flow in a fixed direction.

The booster circuit 12 is not limited to the above example shown in FIG. 12, but can be modified properly.

The external power supply voltage Vcc is applied to one end of a current path of each of transistor NT1 of FIG. 1, transistor PT2 of FIG. 3, transistor NT4 of FIG. 4, and transistor PT6 of FIG. 7. The present invention is not limited to this, but a voltage obtained by decreasing the external power supply voltage Vcc by a pull-down circuit or the like, can be applied.

Figure 13:
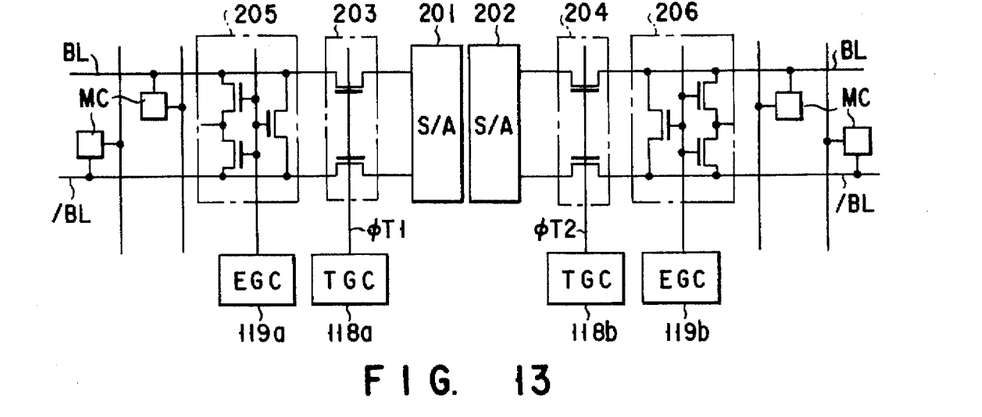
FIGS. 13 to 15 are circuit diagrams each showing another example of the DRAM applied to the present invention.
Figure 14:
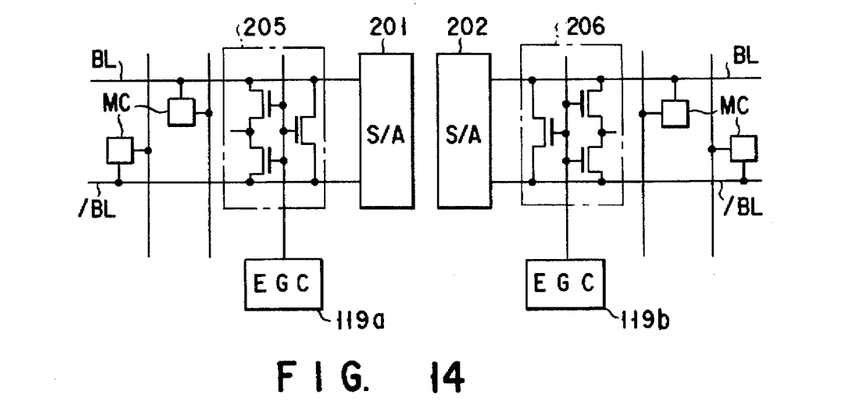
Figure 15:
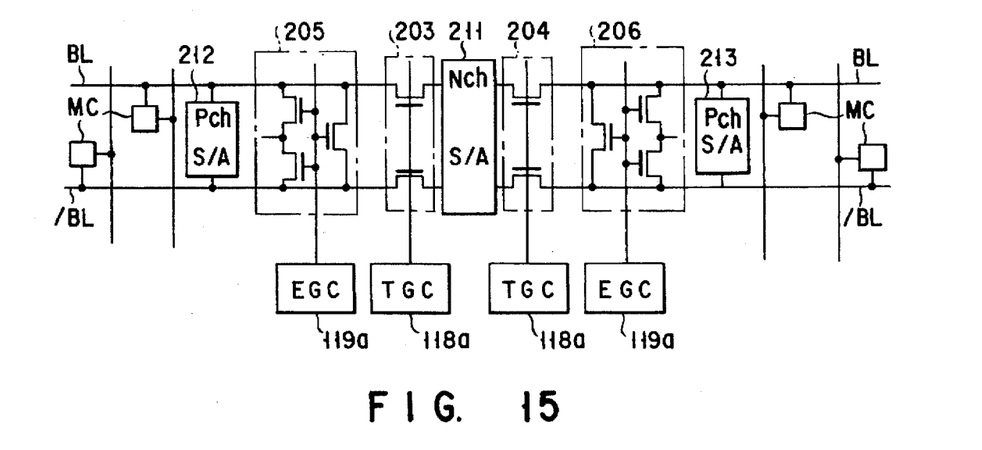

In the circuit arrangement shown in FIG. 11, a sense amplifier is connected to a single bit line pair. The present invention is not limited to this arrangement. For example, as shown in FIGS. 13 to 15, a sense amplifier can be connected to each of two pairs of bit lines. In these figures, the same structural elements as those shown in FIG. 11 are denoted by the same reference numerals and symbols.

More specifically, in FIG. 13, sense amplifiers 201 and 202 are connected to their respective pairs of bit lines BL and /BL to amplify a difference in potential between the bit lines. A first switching circuit 203 is provided between the sense amplifier 201 and its corresponding pair of bit lines, while a second switching circuit 204 is provided between the sense amplifier 202 and its corresponding pair of bit lines. The abovedescribed timing signal generation circuits 118a and 118b are connected to the first and second switching circuits 203 and 204, respectively. While the circuit 203 selectively connects and disconnects the bit line pair and sense amplifier 201 in response to a first control signal $\phi T1$, the circuit 204 selectively connects and disconnects the bit line pair and sense amplifier 202 in response to a second control signal $\phi T2$. Moreover, equalizer circuits 205 and 206 are connected to their respective pairs of bit lines to equalize the potentials of the bit lines. Equalizing signal generation circuits 119a and 119b are connected to the equalizer circuits 205 and 206, respectively.

The circuit shown in FIG. 14 is the same as that shown in FIG. 13, except that it does not have the first and second switching circuits 203 and 204 or the timing signal generation circuits 118a and 118b. The circuit shown in FIG. 15 is also the same as that shown in FIG. 13, except that the potentials of two pairs of bit lines BL and /BL are amplified by a sense amplifier 211 constituted by an N-channel transistor and sense amplifiers 212 and 213 each constituted by a P-channel transistor, and the sense amplifier 211 is common to the two pairs of bit lines.

The same advantage as that of the circuit shown in FIG. 11 can be obtained from the circuits shown in FIGS. 13 to 15.

What is claimed is:

1. A semiconductor device comprising:
    a booster circuit for receiving an external power supply voltage and generating a boosted voltage which is higher than the external power supply voltage;
    a first switching circuit having a current path with a first end connected to the external power supply voltage and a second end connected to an output node, said first switching circuit being turned on in response to a first signal to increase a voltage of said output node up to a voltage equivalent to the external power supply voltage;
    a second switching circuit having a current path with a first end connected to said booster circuit and a second end connected to said output node, said second switching circuit being turned on in response to a second signal when said first switching circuit is turned off, to increase the voltage of the output node up to the boosted voltage; and
    a third switching circuit having a current path with a first end connected to said output node and a second end which is grounded, said third switching circuit being mined on in response to a third signal to make the voltage of the output node equal to a ground potential.

2. The semiconductor device according to claim 1, further comprising a signal generation circuit for generating the first, second and third signals upon receiving an input signal.

3. The semiconductor device according to claim 1, wherein said second switching circuit is turned on in response to the second signal after a lapse of a predetermined period of time after said first switching circuit is turned off in order to increase the voltage of said output node up to the boosted voltage.

4. The semiconductor device according to claim 1, wherein said first and third switching circuits are first conductivity type transistors, and said second switching circuit is a second conductivity type transistor.

5. The semiconductor device according to claim 1, wherein said first and second switching circuits are second conductivity type transistors, and said third switching circuit is a first conductivity type transistor.

6. A semiconductor device comprising:
    a booster circuit for receiving an external power supply voltage and generating a boosted voltage which is higher than the external power supply voltage;
    a first transistor having a current path with a first end connected to the external power supply voltage and a second end connected to an output node, and a gate supplied with a first signal;
    a second transistor having a current path with a first end connected to said booster circuit and a second end connected to said output node, and a gate supplied with a second signal;
    a third transistor having a current path with a first end connected to said output node and a second end which is grounded, and a gate supplied with a third signal; and
    a signal generation circuit for generating the first, second and third signals for turning off said second and third transistors and turning on said first transistor to increase a voltage of said output node up to a voltage equivalent to the external power supply voltage, generating the first, second and third signals for turning off said first and third transistors and taming on said second transistor to increase the voltage of said output node up to the boosted voltage, and generating the first, second and third signals for turning off said first and second transistors and turning on said third transistor to decrease the voltage of said output node down to a ground potential.

7. The semiconductor device according to claim 6, wherein said signal generation circuit turns on said second transistor after a lapse of a predetermined period of time after said first transistor is tamed off in order to increase the voltage of said output node up to the boosted voltage.

8. The semiconductor device according to claim 6, wherein said first and third transistors are first conductivity type transistors, and said second transistor is a second conductivity type transistor.

9. The semiconductor device according to claim 6, wherein said first and second transistors are second conductivity type transistors, and said third transistor is a first conductivity type transistor.

10. A semiconductor device comprising:
    a booster circuit for receiving an external power supply voltage and generating a boosted voltage which is higher than the external power supply voltage;
    a first transistor having a current path with a first end connected to the external power supply voltage and a second end of which is connected to a connection node, and a gate supplied with a first signal;
    a second transistor having a current path with a first end connected to an output terminal of said booster circuit and a second end connected to said connection node, and a gate supplied with a second signal;
    a third transistor having a current path with a first end connected to said connection node and a second end of which is connected to an output node, and a gate supplied with a third signal;
    a fourth transistor having a current path with a first end connected to said output node and a second end which is grounded, and a gate supplied with the third signal; and
    a signal generation circuit for generating the first, second and third signals for turning off said second and fourth transistors and turning on said first and third transistors to increase a voltage of said output node up to a voltage equivalent to the external power supply voltage, generating the first, second and third signals for turning off said first and fourth transistors and turning on said second and third transistors to increase the voltage of said output node up to the boosted voltage, and generating the first, second and third signals for turning off said first, second and third transistors and turning on said fourth transistor to decrease the voltage of said output node down to a ground potential.

11. The semiconductor device according to claim 10, wherein said signal generation circuit turns on said second transistor after a lapse of a predetermined period of time after said first transistor is turned off in order to increase the voltage of said output node up to the boosted voltage.

12. The semiconductor device according to claim 10, wherein said signal generation circuit turns on said second and third transistors after a lapse of a predetermined period of time after said first and third transistors are turned on in order to increase the voltage of said output node up to the boosted voltage.

13. The semiconductor device according to claim 10, wherein said first and fourth transistors are first conductivity type transistors, and said second and third transistors are second conductivity type transistors.

14. The semiconductor device according to claim 10, wherein said first, second and third transistors are second conductivity type transistors, and said fourth transistor is a first conductivity type transistor.

15. A semiconductor device comprising:

first and second bit lines;

memory cells connected to said first and second bit lines;

a sense amplifier connected to said first and second bit lines, for amplifying a difference in potential between said first and second bit lines;

a bit line potential setting circuit for charging said first and second bit lines with a predetermined potential and setting said first and second bit lines to a same potential;

a booster circuit for receiving an external power supply voltage and generating a boosted voltage which is higher than the external power supply voltage; and a voltage control circuit, an output node of which is connected to said bit line potential setting circuit, for receiving the boosted voltage output from said booster circuit, the external power supply voltage and an input signal, and outputting a voltage for controlling said bit line potential setting circuit from said output node in response to the input signal, said voltage control circuit including:

a first switching circuit having a current path with a first end connected to the external power supply voltage and a second end connected to said output node, said first switching circuit being turned on in response to a first signal to increase the voltage of said output node up to a voltage equivalent to the external power supply voltage;

a second switching circuit having a current path with a first end connected to an output terminal of said booster circuit and a second end connected to said output node, said second switching circuit being turned on in response to a second signal when said first switching circuit is turned off, to increase the voltage of said output node up to the boosted voltage;

a third switching circuit having a current path with a first end connected to said output node and a second end which is grounded, said third switching circuit being mined on in response to a third signal to make the voltage of said output node equal to a ground potential; and a signal generation circuit for generating the first, second and third signals in response to the input signal.

16. A semiconductor device comprising:

first and second bit lines;

memory cells connected to said first and second bit lines;

word lines connected to said memory cells, for selecting said memory cells;

a sense amplifier connected to said first and second bit lines, for amplifying a difference in potential between said first and second bit lines;

first and second switching circuits connected between said sense amplifier and said first bit line and between said sense amplifier and said second bit line;

a booster circuit for receiving an external power supply voltage and generating a boosted voltage which is higher than the external power supply voltage; and a voltage control circuit, an output node of which is connected to said first and second switching circuits, for receiving the boosted voltage output from said booster circuit, the external power supply voltage and an input signal, and outputting a voltage for controlling said first and second switching circuits from said output node in response to the input signal, said voltage control circuit including:

a first switching circuit having a current path with a first end connected to the external power supply voltage and a second end connected to said output node, said first switching circuit being turned on in response to a first signal to increase the voltage of said output node up to a voltage equivalent to the external power supply voltage;

a second switching circuit having a current path with a first end connected to an output terminal of said booster circuit and a second end connected to said output node, said second switching circuit being turned on in response to a second signal when said first switching circuit is turned off, to increase the voltage of said output node up to the boosted voltage;

a third switching circuit having a current path with a first end connected to said output node and a second end which is grounded, said third switching circuit being turned on in response to a third signal to make the voltage of said output node equal to a ground potential; and a signal generation circuit for generating the first, second and third signals in response to the input signal.

17. A semiconductor device comprising:

memory cells;

word lines connected to said memory cells, for selecting said memory cells;

a word line driving circuit for driving said word lines;

a booster circuit for receiving an external power supply voltage and generating a boosted voltage which is higher than the external power supply voltage; and a voltage control circuit, an output node of which is connected to said word line driving circuit, for receiving the boosted voltage output from said booster circuit, the external power supply voltage and an input signal, and outputting the boosted voltage from said output node in response to the input signal, said voltage control circuit including:

a first switching circuit having a current path with a first end connected to the external power supply voltage and a second end connected to said output node, said first switching circuit being mined on in response to a first signal to increase the voltage of said output node up to a voltage equivalent to the external power supply voltage;

a second switching circuit having a current path with a first end connected to an output terminal of said booster circuit and a second end connected to said output node, said second switching circuit being turned on in response to a second signal when said first switching circuit is turned off, to increase the voltage of said output node up to the boosted voltage;

a third switching circuit having a current path with a first end connected to said output node and a second end which is grounded, said third switching circuit being mined on in response to a third signal to make the voltage of said output node equal to a ground potential; and a signal generation circuit for generating the first, second and third signals in response to the input signal.

18. A semiconductor device comprising:

two pairs of bit lines;

memory cells connected to said two pairs of bit lines;

a first sense amplifier connected to one of said two pairs of bit lines, for amplifying a difference in potential between said bit lines;

a second sense amplifier connected to another of said two pairs of bit lines, for amplifying a difference in potential between said bit lines;

a bit line potential setting circuit for charging said two pairs of bit lines with a predetermined potential and setting said two pairs of bit lines to a same potential;

a booster circuit for receiving an external power supply voltage and generating a boosted voltage which is higher than the external power supply voltage; and a first voltage control circuit, an output node of which is connected to said bit line potential setting circuit, for receiving the boosted voltage of said booster circuit, the external power supply voltage and an input signal, and outputting the boosted voltage from said output node in response to the input signal, said first voltage control circuit including:

a first switching circuit having a current path with a first end connected to the external power supply voltage and a second end connected to said output node, said first switching circuit being turned on in response to a first signal to increase the voltage of said output node up to a voltage equivalent to the external power supply voltage;

a second switching circuit having a current path with a first end connected to an output terminal of said booster circuit and a second end connected to said output node, said second switching circuit being turned on in response to a second signal when said first switching circuit is mined off, to increase the voltage of said output node up to the boosted voltage;

a third switching circuit having a current path with a first end connected to said output node and a second end which is grounded, said third switching circuit being mined on in response to a third signal to make the voltage of said output node equal to a ground potential; and a signal generation circuit for generating the first, second and third signals in response to the input signal.

19. The semiconductor device according to claim 18, further comprising:

a fourth switching circuit provided between said one of the two pairs of bit lines and said first sense amplifier, for electrically connecting and disconnecting said one of the two pairs of bit lines and said first sense amplifier in response to a first control signal;

a fifth switching circuit provided between said another of the two pairs of bit lines and said second sense amplifier, for electrically connecting and disconnecting said another of the two pairs of bit lines and said second sense amplifier in response to a second control signal; and a second voltage control circuit, an output node of which is connected to said fourth and fifth switching circuits, for receiving the boosted voltage of said booster circuit and the external power supply voltage and outputting the boosted voltage of said booster circuit as the first and second control signals in response to the input signal.

20. A semiconductor device comprising:

two pairs of bit lines;

memory cells connected to said two pairs of bit lines;

a first sense amplifier constituted by a first conductivity type transistor and connected to said two pairs of bit lines, said first sense amplifier amplifying a difference in potential between said bit lines;

second sense amplifiers constituted by a second conductivity type transistor, each of said sense amplifiers being connected to one of said two pairs of bit lines, said second sense amplifiers amplifying a difference in potential between said bit lines;

bit line potential setting circuits, connected to said two pairs of bit lines, respectively, for charging said two pairs of bit lines with a predetermined potential and setting said two pairs of bit lines to a same potential;

switching circuits, each connected to each of said two pairs of bit lines, for selectively connecting said first sense amplifier to said two pairs of bit lines;

a booster circuit for receiving an external power supply voltage and generating a boosted voltage which is higher than an external power supply voltage;

first voltage control circuits, output nodes of which are connected to said bit line potential setting circuits, respectively, for receiving the boosted voltage of said booster circuit, the external power supply voltage and a first input signal, and outputting the boosted voltage from said output node thereof in response to the first input signal; and second voltage control circuits, output nodes of which are connected to said switching circuits, respectively, for receiving the boosted voltage of said booster circuit, the external power supply voltage and a second input signal, and outputting the boosted voltage from said output node thereof in response to the second input signal, each of said first and second voltage control circuits including:

a first switching circuit having a current path with a first end connected to the external power supply voltage and a second end connected to said output node thereof, said first switching circuit being turned on in response to a first signal to increase the voltage of said output node thereof up to a voltage equivalent to the external power supply voltage;

a second switching circuit having a current path with a first end connected to an output terminal of said booster circuit and a second end connected to said output node thereof, said second switching circuit being turned on in response to a second signal when said first switching circuit is turned off, to increase the voltage of said output node thereof up to the boosted voltage;

a third switching circuit having a current path with a first end connected to said output node thereof and a second end which is grounded, said third switching circuit being turned on in response to a third signal to make the voltage of said output node thereof equal to a ground potential; and a signal generation circuit for generating the first, second and third signals in response to one of the first and second input signals.

21. A semiconductor device, comprising:

a boosted voltage generating circuit for generating a boosted voltage having a voltage level higher than a voltage level of a first voltage supplied to an input thereof;

a voltage control circuit for controlling a voltage supplied to a circuit of said semiconductor device connected to an output node thereof, said voltage control circuit comprising:

a first switch connected between a second voltage and said output node, said first switch being switched on in response to a first switch control signal to bring said output node to a first output level corresponding to the second voltage;

a second switch connected between said booster circuit and said output node, said second switch being switched on in response to a second switch control signal to bring said output node to a second output voltage level corresponding to the boosted voltage; and a third switch connected between a third voltage and said output node, said third switch being switched on in response to a third switch control signal to bring said output node to a third output voltage level corresponding to the third voltage.

22. A semiconductor device according to claim 21, wherein a signal generation circuit for generating the first, second and third signals for turning off said second and third switches and turning on said first switch to bring said output node to the first output voltage level, generating the first, second and third signals for turning off said first and third switches and turning on said second switch to bring said output node to the second output voltage level, and generating the first, second and third signals for turning off said first and second switches and turning on said third switch to bring said output node to the third output voltage level.

* * * * *